United States Patent [19]

Levain et al.

[11] Patent Number: 5,290,991
[45] Date of Patent: Mar. 1, 1994

[54] ADJUSTMENT PROCESS OF AN ELECTRONIC TRIP DEVICE

[76] Inventors: Marc Levain, 3, Allée de la Pelouse, F 38100 Grenoble; Didier Fraisse, 5, Allée du Doulan, F 38400 St. Martin D'Heres, both of France

[21] Appl. No.: 913,391

[22] Filed: Jul. 15, 1992

[30] Foreign Application Priority Data

Jul. 23, 1991 [FR] France .................... 91 09406

[51] Int. Cl.⁵ ............................................. B23K 26/00
[52] U.S. Cl. ............................................. 219/121.69
[58] Field of Search ............... 219/121.68, 121.69; 338/195

[56] References Cited

U.S. PATENT DOCUMENTS

| | | | |
|---|---|---|---|
| 3,916,142 | 10/1975 | Ennis | 219/121.69 |
| 4,207,536 | 6/1980 | Lewis | 330/69 |
| 4,381,441 | 4/1983 | Desmarais et al. | 219/121.69 |
| 5,027,060 | 6/1991 | Fraisse | 324/132 |

FOREIGN PATENT DOCUMENTS 0412024 2/1991 European Pat. Off. .

*Primary Examiner*—C. L. Albritton
*Attorney, Agent, or Firm*—Parkhurst, Wendel & Rossi

[57] ABSTRACT

The passive components of the analog channel of the trip device are achieved by serigraphy on a thick layered hybrid circuit. Adjustment, by laser, of the value of an offset voltage compensating resistance and of a measuring resistance enables the offset voltage and gain of the channel to be adjusted with precision.

7 Claims, 1 Drawing Sheet

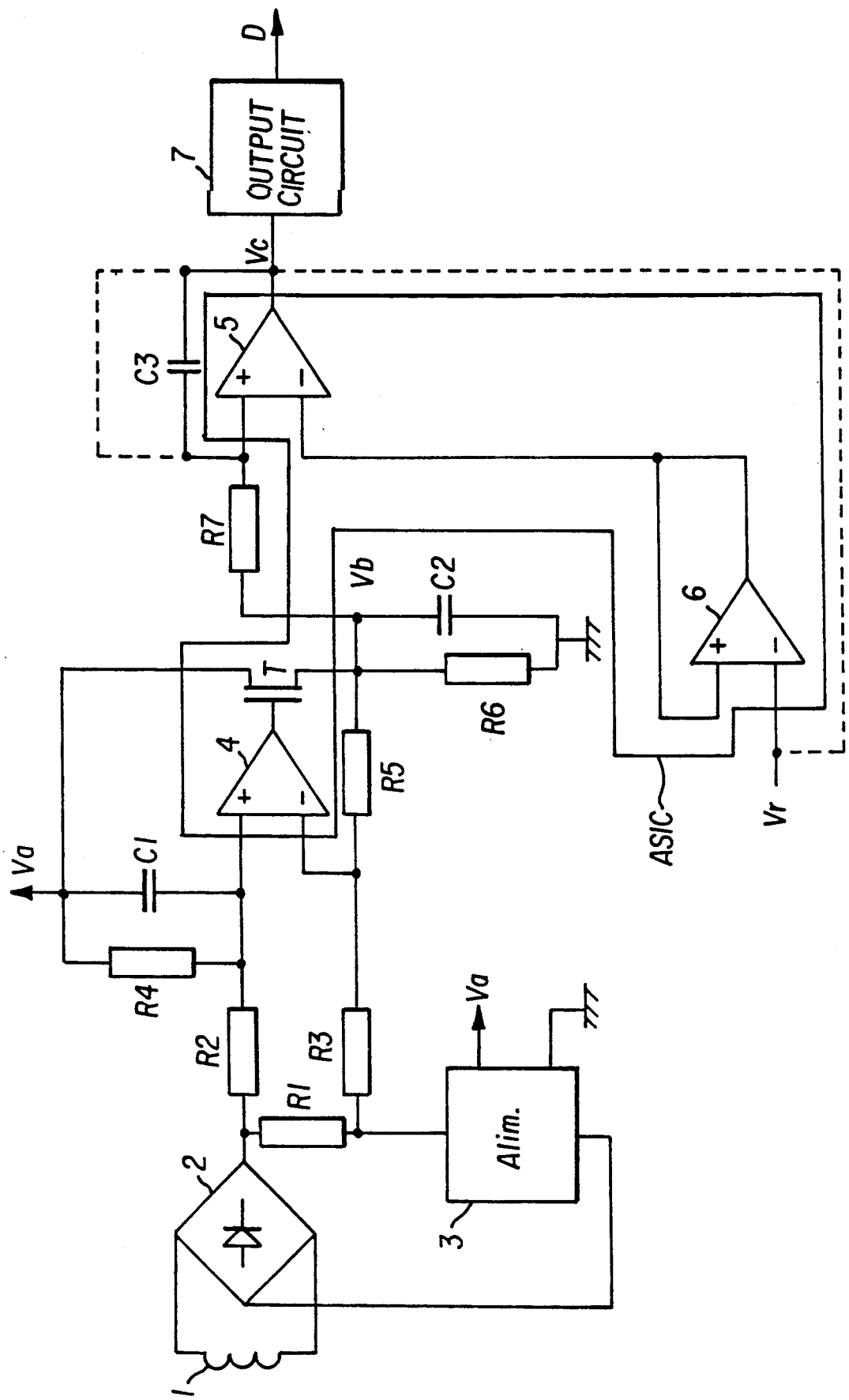

ADJUSTMENT PROCESS OF AN ELECTRONIC TRIP DEVICE

BACKGROUND OF THE INVENTION

The invention relates to an adjustment process of an electronic trip device comprising an analog channel whose input is connected to means for measuring current, the channel comprising at least a measuring resistance connected to the means for measuring current and at least a first operational amplifier connected to the terminals of the measuring resistance.

Conventional electronic trip devices comprise a certain number of adjusting resistances designed, at the end of manufacture, to adjust the characteristics of the trip device with a preset precision. Generally an adjusting potentiometer is connected in series with a resistance to form the adjusting resistance. This manual adjustment process is long and costly. It has also been proposed to use networks of resistances connected in parallel, each resistance of the network being connected in series with a fuse component. Selective blowing of one or more of these fuse components enables the value of the resistance equivalent to the network to be adjusted accurately. In some microprocessor-based trip devices an electrically alterable read-only memory (EAROM) is used to store a correction factor to be applied to the measured values.

Conventional adjustment processes are long and costly. The object of the invention is to provide an automatic adjustment process designed to maintain the characteristics of the trip device within preset limits.

SUMMARY OF THE INVENTION

According to the invention, this object is achieved by the fact that the adjustment process comprises a stage producing, by serigraphy on a hybrid circuit, the measuring resistance and an offset voltage compensating resistance, having preset minimum values and an offset voltage compensating stage consisting in injecting successively first and second currents of preset values to the input of the channel, of measuring corresponding first and second output voltages of the channel, of injecting a third current of preset value, and of adjusting, by laser, the value of the offset voltage compensating resistance so as to obtain an output voltage equal to the product of the third current and of the ratio between the difference between the first and second output voltages and the difference between the first and second input currents.

A very precise and very stable adjusting resistance value is thus obtained.

According to a preferred embodiment, the offset voltage compensating resistance is connected between an input of the first operational amplifier and a supply voltage.

In some cases the analog channel of the trip device comprises a second operational amplifier whose non-inverting input is connected to the output by a capacitor so as to form an integrator stage connected in series with the first amplifier. Then, during the offset voltage compensating stage the capacitor is short-circuited and the integrator output is connected to the inverting input of the second amplifier by means of a third operational amplifier mounted as an inverter.

The adjustment process preferably also comprises a channel gain adjusting stage consisting in injecting a fourth current of predetermined value to the channel input and in adjusting, by laser, the value of the measuring resistance to obtain a predetermined output voltage equal to the product of the measuring resistance, of the value of the fourth current and of the gain. The value of the fourth current is selected close to the value of the long delay threshold of the trip device.

The adjustment process according to the invention enables a good precision of the trip device characteristics to be obtained even when the active components of the analog channel are integrated in an application specific integrated circuit (ASIC) whose characteristics with respect to the offset voltage are generally mediocre. Mounting this ASIC on the hybrid circuit comprising the adjusting resistances in fact enables the adjustment process according to the invention to be used and overcomes this drawback.

BRIEF DESCRIPTION OF THE DRAWINGS

Other advantages and features will become more clearly apparent from the following of an illustrative embodiment of the invention, given as a non-restrictive example only and represented in the single accompanying drawing.

DESCRIPTION OF THE PREFERRED EMBODIMENT

The figure essentially represents the analog processing channel of the trip device. The input of this channel is connected to a current measuring toroid 1. The ends of the toroid are connected to a rectifier circuit 2, preferably a bridge rectifier. A measuring resistance R1 is connected, in series with a power supply circuit 3, to the output terminal of the rectifier circuit 2. The power supply circuit supplies a supply voltage Va to the whole electronic trip device assembly. A voltage representative of the current measured by the toroid 1 is thus obtained at the terminals of the measuring resistance R1.

In the embodiment represented in the figure, the voltage at the terminals of the measuring resistance R1 is applied, via resistances R2 and R3, to the input terminals of a first operational amplifier 4. A resistance R4 is connected in parallel with a capacitor C1 between the non-inverting input of the amplifier 4 and the supply voltage Va. The resistance R4 and capacitor C1 form a low-pass filter. The output of the amplifier 4 is connected to the gate of a metal oxide semiconductor field effect (MOS) type transistor T, whose drain is connected to the supply voltage Va and whose source is connected to the inverting input of the amplifier 4 by a resistance R5 and is grounded by a resistance R6 connected in parallel to a capacitor C2. The assembly constitutes a peak detector.

If the cutoff frequency of the low-pass filter is suitably selected, the voltage Vb obtained at the terminals of the resistance R6 is representative of the rms value of the input signal of the rectifier circuit 2. A circuit of this type is described in French Patent application 2,650,395 corresponding to U.S. Pat. No. 5,027,060 which should be referred to for further details.

In the figure the voltage Vb is applied, via a resistance R7, to the non-inverting input of a second operational amplifier 5, itself connected to the output of the amplifier 5 by a capacitor C3. A reference voltage Vr is applied to the inverting input of the second amplifier 5 via a third operational amplifier 6, mounted as a follower amplifier. The voltage Vr is applied to the inverting input of the third amplifier 6 whose non-inverting input is connected to the output. The second amplifier 5 therefore operates as an integrator, of time constant R7C3, when the voltage Vb is greater than the reference voltage Vr. An integrator of this kind is notably used to perform a long delay function of the trip device.

In the figure, the integrator output constitutes the output of the analog channel whose accuracy is to be adjusted by the invention. The integrator output voltage Vc is applied to the input of an output circuit 7, for example a comparison circuit supplying a tripping signal D when the voltage Vc reaches a preset threshold.

All the components making up the analog channel are disposed on a thick layered hybrid circuit. The active components, including the first, second and third operational amplifiers 4-6 and the MOS type transistor T, are preferably contained in an ASIC itself fitted on the circuit. The resistances are formed by serigraphy on the hybrid circuit.

The transfer function of the analog channel can be put down in the form:

$$Vc = a \, VR1 + b \tag{1}$$

where a is the channel gain, VR1 the voltage at the terminals of the measuring resistance R1 and b the offset voltage of the analog channel.

The adjusting process comprises a compensating stage of the offset voltage b. This stage consists firstly in successively injecting, to the input of the rectifier 2, two sinusoidal currents, whose values I1 and I2 after rectification are known. The corresponding values Vc1 and Vc2 of the output signal Vr of the channel are measured. In the embodiment represented where the analog channel comprises an integrator, the time constant of the integrator is eliminated by short-circuiting (dashed line) its capacitor C3 during the offset voltage compensating stage. The voltage Vc is at the same time applied to the reference input of the amplifier 6 as indicated in dashed lines in the figure. The values Vc1 and Vc2 then have the form:

$$Vc1 = a. \, R1. \, I1 + b \tag{2}$$

$$Vc2 = a. \, R1. \, I2 + b \tag{3}$$

$$i.e. \; a. \, R1 = (Vc1 - Vc2)/(I1 - I2) \tag{4}$$

A sinusoidal current, of known value I3 after rectification, is then applied to the rectifier input. The resistance R4, serigraphed beforehand so as to have a preset minimum value, acts as offset voltage compensating resistance. This resistance connected between the power supply Va and an input of the first operational amplifier 4 in fact constitutes a common mode resistance. Its value is adjusted by laser so as to obtain on output a voltage Vc3 such that:

$$Vc3 = a. \, R1. \, I3 \tag{5}$$

$$Vc3 = I3 \, (Vc1 - Vc2)/(I1 - I2) \tag{6}$$

I3 can naturally be chosen such that I3=I1 and the following is then obtained:

$$Vc3 = (Vc1 - Vc2)/(1 - I2/I1) \tag{7}$$

The use of a compensating resistance R4 achieved by serigraphy on a thick layered hybrid circuit enables very quick dynamic adjustment of the offset voltage using the output voltage Vc3 as setpoint voltage.

The invention is in no way limited to using the resistance R4 as compensating resistance. The resistance R2 could in fact likewise act as compensating resistance.

The measuring resistance R1 is likewise used to adjust the channel gain. When adjustment of the offset voltage has been carried out, the channel is reset to its normal operating state, i.e. the connections represented in dashed lines in the figure are removed and a reference voltage Vr applied to the input of the amplifier 6. A current of preset value I4, close to the value of the long delay threshold, is applied to the input of the channel. The value of the measuring resistance R2, previously at a minimum value, is adjusted by laser so as to supply an output voltage Vc4 of preset value such that:

$$Vc4 = R1. \, I4. \, k \tag{8}$$

The coefficient k corresponds to the required gain or, in the embodiment represented, to the product of the required gain in the channel and of the ratio between the measured reference voltage Vr and the nominal reference voltage required.

In a preferred embodiment the value I4 is equal to 1.125 Is, Is being the long delay threshold.

The adjustment process according to the invention is applicable to any analog processing channel comprising at least one operational amplifier. It enables the offset voltage of the channel to be eliminated by means of a common mode resistance serigraphed onto a hybrid circuit and whose value is adjusted by laser in the course of dynamic adjustment. In addition, it enables the gain of the channel to be adjusted with precision by means of an input resistance, itself also serigraphed onto the hybrid circuit and connected between the input terminals of the first amplifier.

Although the circuit represented only comprises a single phase, it is quite obvious that the same process is applicable to adjustment of a multiphase trip device.

We claim:

1. An adjustment process of an electronic trip device comprising an analog channel whose input is connected to means for measuring current, the channel comprising at least a measuring resistance connected to the means for measuring current and at least a first operational amplifier connected to the terminals of the measuring resistance, a process comprising a stage producing, by serigraphy on a hybrid circuit, the measuring resistance and an offset voltage compensating resistance, having preset minimum values, and an offset voltage compensating stage consisting in injecting successively first and second currents of preset values to the input of the channel, of measuring corresponding first and second output voltages of the channel, of injecting a third current of preset value, and of adjusting, by laser, the value of the offset voltage compensating resistance so as to obtain an output voltage equal to the product of the third current and of the ratio between the difference between the first and second output voltages and the difference between the first and second input currents.

2. The process according to claim 1, wherein the offset voltage compensating resistance is connected between an input of the first operational amplifier and a supply voltage.

3. The process according to claim 1, wherein the analog channel comprising a second operational amplifier whose non-inverting input is connected to the output by a capacitor so as to form an integrator stage connected in series with the first amplifier, during the offset voltage compensating stage the capacitor is short-circuited and the integrator output is connected to the inverting input of the second amplifier by means of a third operational amplifier mounted as an inverter.

4. The process according to claim 1, comprising a channel gain adjusting stage consisting in injecting a fourth current of predetermined value to the channel input and in adjusting, by laser, the value of the measuring resistance to obtain a predetermined output voltage equal to the product of the measuring resistance, of the value of the fourth current and of the gain.

5. The process according to claim 4, wherein the value of the fourth current is close to the value of the long delay threshold of the trip device.

6. The process according to claim 4, wherein the value of the channel gain is a function of the ratio between a measured reference voltage to be applied to the channel and a predetermined nominal reference voltage.

7. The process according to claim 1, wherein the active components of the analog channel are integrated in an ASIC mounted on the hybrid circuit.

* * * * *